United States Patent
Patrick et al.

(10) Patent No.: US 7,244,646 B2
(45) Date of Patent: Jul. 17, 2007

(54) PIXEL DESIGN TO IMPROVE PHOTODIODE CAPACITANCE AND METHOD OF FORMING SAME

(75) Inventors: Inna Patrick, Boise, ID (US);
Vladimir Berezin, La Crescenta, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/086,347

(22) Filed: Mar. 23, 2005

(65) Prior Publication Data

US 2005/0164421 A1    Jul. 28, 2005

Related U.S. Application Data

(62) Division of application No. 10/461,802, filed on Jun. 16, 2003, now Pat. No. 7,009,227.

(51) Int. Cl.
*H01L 21/8234* (2006.01)
(52) U.S. Cl. ............... 438/237; 438/328; 438/199; 257/E21.35; 257/E21.36; 257/E27.133
(58) Field of Classification Search ............... 438/46, 438/57, 45, 2, 22, 29, FOR. 415, FOR. 416, 438/208, 197–199, 149, 151, 157, 283, 237, 438/328, 979, 938, FOR. 157, FOR. 287; 257/E31.058, E25.032, 233, E21.053, E27.133, 257/E21.35–E21.357, E21.632, E21.637, 257/E21.36, E21.362, E21.368, E29.336
See application file for complete search history.

(56) References Cited

U.S. PATENT DOCUMENTS

| | | | |
|---|---|---|---|
| 5,286,990 A | 2/1994 | Hynecek | |
| 6,051,447 A * | 4/2000 | Lee et al. | 438/48 |
| 6,140,630 A | 10/2000 | Rhodes | |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,441,412 B2 * | 8/2002 | Oh et al. | 257/292 |
| 6,706,550 B2 * | 3/2004 | Lee et al. | 438/57 |
| 2002/0045306 A1 * | 4/2002 | Watanabe | 438/224 |
| 2002/0090748 A1 * | 7/2002 | Lee et al. | 438/30 |

OTHER PUBLICATIONS

Definition of "Share", Merriam-Webster Dictionary Online, http://m-w.com□□.*

* cited by examiner

*Primary Examiner*—Michelle Estrada
*Assistant Examiner*—Quovaunda Jefferson
(74) *Attorney, Agent, or Firm*—Dickstein Shapiro LLP

(57) ABSTRACT

A CMOS imager with two adjacent pixel active area regions without the presence of an intervening trench isolation region that typically separates two adjacent pixels and their associated photodiodes is provided. The shared active area region isolates the two adjacent photodiodes and provides good substrate to surface pinned layer contact without the presence of n– type dopant ions and due to the presence of p-type dopant ions. As a result, the size of the imager can be reduced and the photodiodes of the two adjacent pixels have increased capacitance.

26 Claims, 7 Drawing Sheets

PIXEL DESIGN TO IMPROVE PHOTODIODE CAPACITANCE AND METHOD OF FORMING SAME

CROSS-REFERENCE TO RELATED APPLICATION

This application is a divisional of U.S. patent application Ser. No. 10/461,802, filed on Jun. 16, 2003, now U.S. Pat. No. 7,009,227 the subject matter of which is incorporated in its entirety by reference herein.

FIELD OF THE INVENTION

The present invention relates generally to the field of semiconductor devices and more particularly, to a CMOS imager device having a photodiode.

BACKGROUND OF THE INVENTION

The semiconductor industry currently uses different types of semiconductor-based imagers including charge coupled devices (CCD) and CMOS imager devices. Because of the inherent limitations in CCD technology, CMOS imagers have been increasingly used as low-cost imaging devices. A fully compatible CMOS sensor technology enabling a higher level of integration of an image array with associated processing circuits is beneficial for many digital applications.

A CMOS image sensor circuit includes a focal plane array of pixel cells, each one of the cells including a photoconversion device, for example, a photogate, photoconductor, or a photodiode for accumulating photogenerated charge in a doped portion of the substrate. A readout circuit is connected to each pixel cell and includes at least an output transistor, which receives photogenerated charges, typically from a doped floating diffusion region, and produces an output signal which is periodically read-out through a row select access transistor. The imager may optionally include a transistor for transferring charge from the photoconversion device to the floating diffusion region or the floating diffusion region may be directly connected to or part of the photoconversion device. A transistor is also typically provided for resetting the diffusion region to a predetermined charge level before it receives the photoconverted charges.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the foregoing patents are hereby incorporated by reference herein in their entirety.

In a conventional CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of signals representing the reset state and a pixel charge signal. Photo-charge may be amplified when it moves from the initial charge accumulation region to the floating diffusion node through a transfer transistor. The charge at the floating diffusion node is converted to a pixel output voltage by the source follower output transistor.

A known three-transistor (3T) CMOS active pixel sensor (APS) design used in many applications contains a photodiode for producing charges which are stored at a diffusion region, a reset transistor for resetting the diffusion region charge, a source follower transistor having a gate connected to the diffusion region for producing an output signal, and a row select transistor for selectively connecting the source follower transistor to a column line of a pixel array. In a four-transistor (4T) CMOS configuration, a transfer transistor is employed to gate charges from the photodiode to the diffusion region.

FIG. 1 illustrates a diagrammatic side sectional view of a portion of a CMOS image sensor four-transistor (4T) pixel employing a n+ highly-doped floating diffusion region 10.

The CMOS image sensor pixel 100 generally comprises a charge collection region 35 of a photodiode 11 for collecting charges generated by light incident on the pixel, and a transfer transistor having a gate 60 for transferring photoelectric charges from the collection region 35 to the floating diffusion region 10. The floating diffusion region 10 is electrically connected to the gate of an output source follower transistor 40. The pixel 100 also includes a reset transistor having a gate 50 for resetting the floating diffusion region 10 to a predetermined voltage before charge is transferred thereto from the photodiode 11, the source follower transistor 40 which receives at its gate an electrical signal from the floating diffusion region 10, and a row select transistor 70 for selectively outputting a signal from the source follower transistor 40 to a column line 71 in response to a decoded row address driver signal applied to the gate of the transistor 70.

The exemplary pixel 100 of FIG. 1 employs pinned photodiode 11 having charge collection region 35 for converting photons to charge on a semiconductor substrate 2. The pinned photodiode 11 is termed such since the potential in the photodiode 11 is pinned to a constant value when the photodiode 11 is fully depleted. The pinned photodiode 11 has a photosensitive p-n junction region comprising a p– type surface layer 4 and a n– type photodiode region 35 e.g., a charge collection region, within a p– type type 6. The p– type region 6 is formed within semiconductor substrate 2. The two p– type regions 4, 6 cause the n– type photodiode region 35 to be fully depleted at a pinning voltage. Impurity doped source/drain regions having n– type conductivity are provided about the transistor gates 50 and 60. The floating diffusion region 10 adjacent to transfer gates 51, 61 is a common source/drain region for a transfer transistor having gate 60 and the reset transistor having gate 50.

In a typical CMOS image sensor, trench isolation regions 8 formed in a p-well active layer 6 and adjacent to the charge collection region 35 are used to isolate the pixels. The gate stacks for the pixel transistors are formed before or after the trench isolation regions are formed. The order of these preliminary process steps may be varied as is required or convenient for a particular process flow.

A transparent insulating layer 99 is typically formed over the pixel 100. Conventional processing methods are then carried out to form, for example, metal conductor 15 in the insulating layer to provide an electrical connection/contact to the floating diffusion region 10, and other wiring to connect gate lines and other connections in pixel 100. For example, the entire substrate surface may be covered with a passivation layer of e.g., silicon dioxide, BSG, PSG, or BPSG, as a transparent insulating layer 99, which is planarized and etched to provide contact holes, which are then metallized to provide contacts to diffusion node 10.

In conventional CMOS image sensors, electrons are generated from light incident externally and accumulate in the n− type photodiode region 35. These charges are transferred to the floating diffusion region 10 by the gate 60 of the transfer transistor. The source follower transistor 40 produces an output signal from the transferred charges.

A maximum output signal is proportional to the number of electrons extracted from the n− type photodiode region 35. The maximum output signal increases with increased electron capacitance or acceptability of the photodiode. The electron capacity of pinned photodiodes typically depends on doping levels and the dopants implanted to form regions 4, 6, and 35. In particular, regions 4 and 35 dominate the pinned photodiode's 11 capacitance. Accordingly, increasing the pinned photodiode's 11 capacitance is useful to allow capture of greater levels of photoconverted charges.

Reducing dark current of the photodiode 11 is also important in CMOS image sensor fabrication. Dark current is generally attributed to leakage in the charge collection region 35 of the pinned photodiode 11, which is strongly dependent on the doping implantation conditions of the photodiode. In particular, high dopant concentrations in p-type electrical connection region 23 typically increases dark current.

CMOS imagers further suffer from poor signal to noise ratios and poor dynamic range as a result of the inability to fully collect and store the electric charge collected in the region 35. Since the size of the pixel electrical signal is very small, the signal to noise ratio and dynamic range of the pixel should be as high as possible.

There is, therefore, a need for an active pixel photosensor for use in a CMOS imager which increases a pinned photodiode's capacitance and resistance to dark current. A method of fabricating such an active pixel photosensor is also desired.

BRIEF SUMMARY OF THE INVENTION

Embodiments of the present invention provide two photodiodes having a doped regions of a first conductivity in contact with a doped region of a second conductivity. Specifically, in one exemplary embodiment, the active area regions between two adjacent pixels are commonly shared by their associated photodiodes. In an exemplary embodiment, the trench isolation structure is omitted, thereby allowing two adjacent pixels to commonly share an active area region. The commonly shared active area region isolates the two adjacent photodiodes and provides good ground contact from the surface to the substrate in the absence of n− type dopants. As a result, the size of the imager can be scaled down and the two adjacent pixel photodiodes have increased capacitance.

These and other features of the invention will be more apparent from the following detailed description that is provided in connection with the accompanying drawings and illustrated exemplary embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-1, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager array will proceed simultaneously in a similar fashion.

Figure 1:
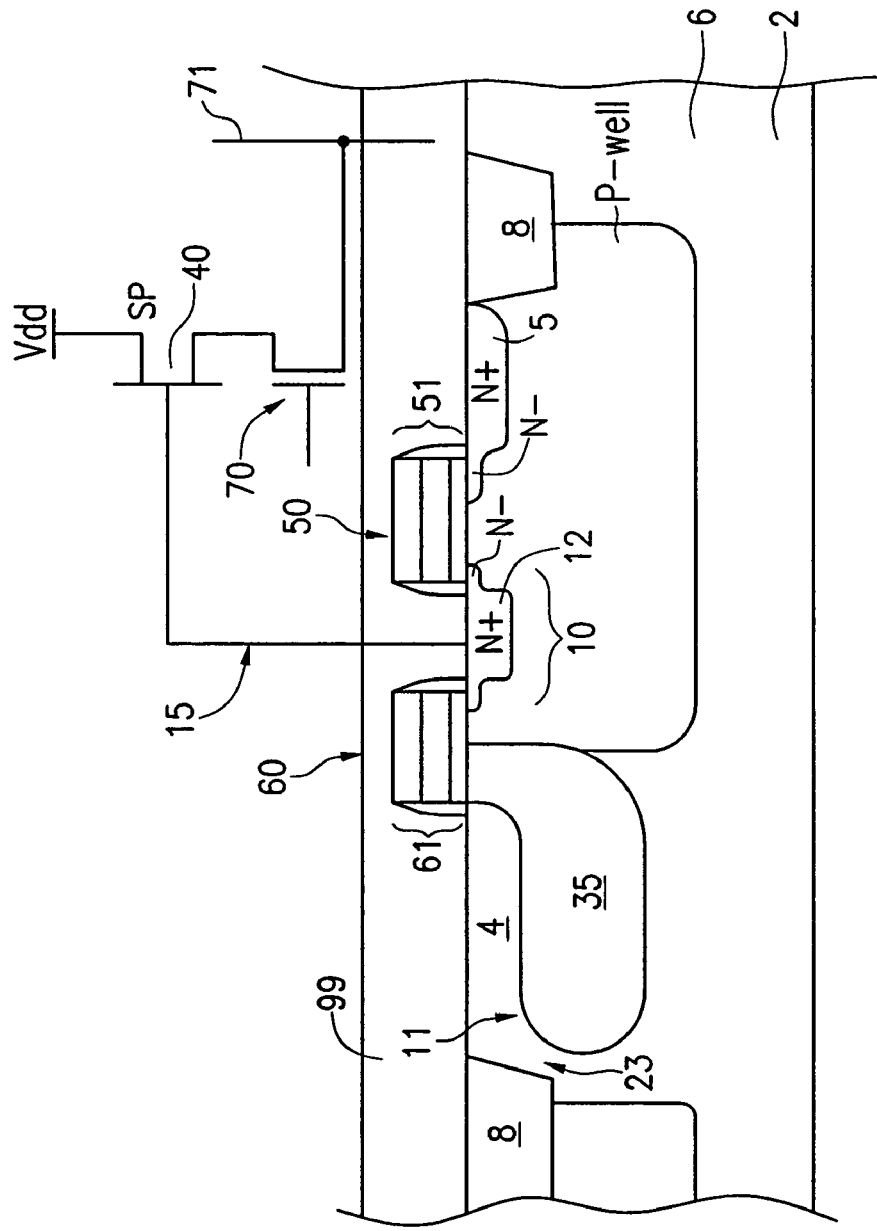
FIG. 1 is a diagrammatic side sectional view of a portion of a conventionally-formed CMOS image sensor pixel.
Figure 2:
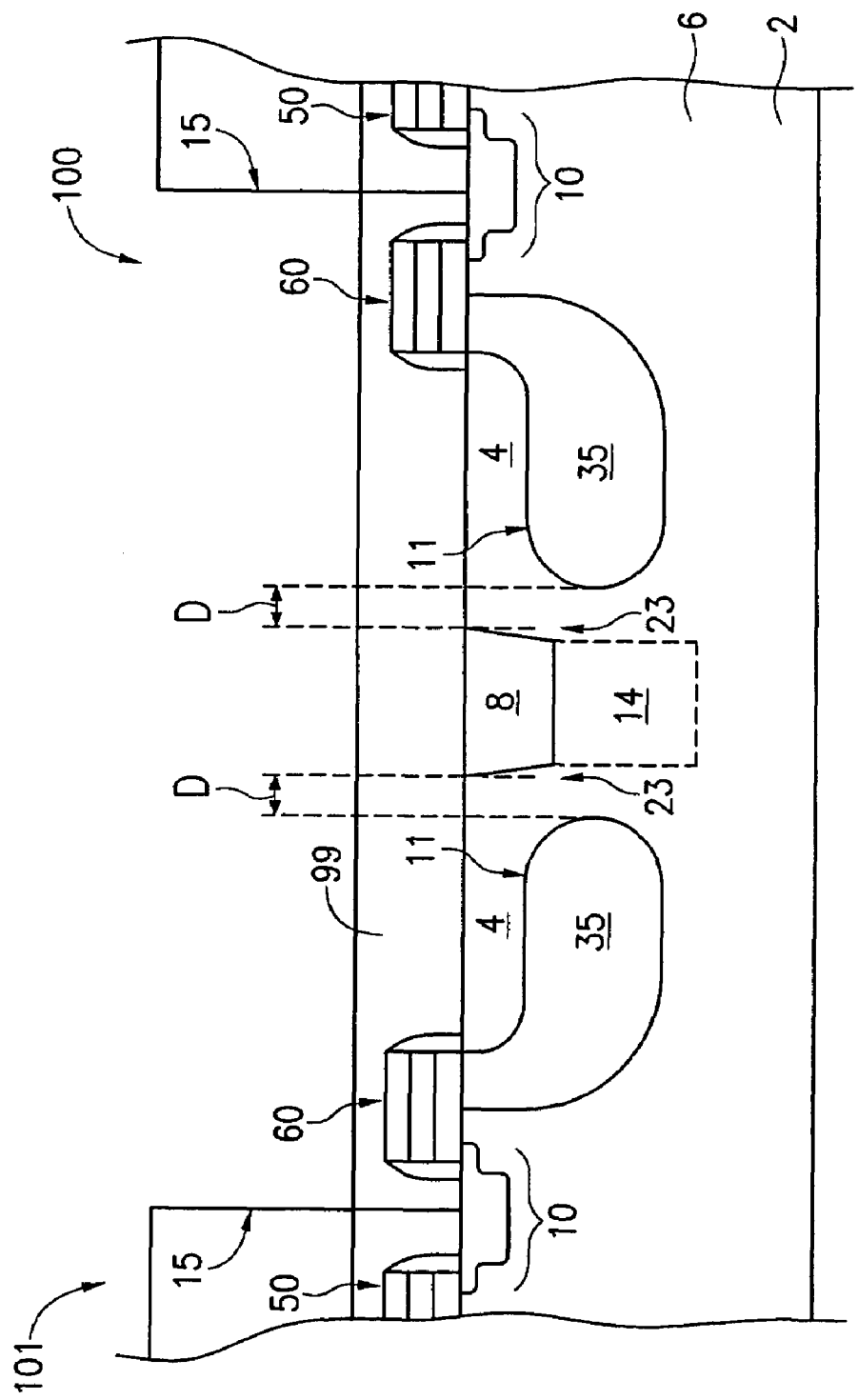
FIG. 2 is a diagrammatic side sectional view of a portion of the photodiodes of two conventionally-formed adjacent pixels.

FIG. 2 illustrates two conventionally formed adjacent pixel cells 100 and 101 with pinned photodiodes 11 of a 4T pixel. The pixel cells 100, 101 each have a single pinned photodiode 11 that is formed having a photosensitive p-n junction region comprising a p− type surface layer 4 and a n− type photodiode region 35 within a p− type region 6. P-type region 6 is formed on semiconductor substrate 2. Trench isolation region 8 is formed in the active layer 6 adjacent to the pinned photodiodes 11 and physically separates the two adjacent pixel cells' photodiodes 11.

Trench isolation region 8 is typically formed by etching trenches into the active layer 6 to provide a physical barrier between adjacent pixel cells, such as pixel cells 100 and 101. This serves to isolate pixel cells electrically and optically from one another. The presence of trench isolation region 8 requires additional real estate in the formation of a pixel array. As FIG. 2 illustrates, below the trench isolation region 8, a p-well 14 is present in the active layer 6.

Further, with the presence of the trench isolation region 8, dopant ions that are implanted in the active layer 6 surrounding the trench isolation region 8, induce current leakage at the junction between the active device region and trench region. The presence of the STI region 8 also introduces stress that can have an undesirable effect on leakage.

Moreover, the dominant crystallographic planes along the bottom and sidewalls of the trench isolation region 8 possess a higher silicon density than the adjacent silicon substrate and, therefore, creates a high density of trap sites along the side and bottom of the trench isolation region 8. These trap sites can become charged and can lead to undesired darkcurrent. Therefore, a minimal distance "D" needs to be maintained between the charge collection region 35 and trench isolation region 8 to avoid generating dark current and to have good substrate 2 to pinned layer 4 contact. This results in a decrease of pixel area available to the charge collection region 35, e.g., a n-type region 35, for electron storage which limits the capacitance of pixel cell 101.

The invention will now be explained with reference to FIGS. 3-5 which illustrate exemplary embodiments of a semiconductor device with a pinned photodiode region constructed in accordance with the invention. The pinned photodiode region includes a charge collection region for collecting electrons generated from photons. It should be understood that similar reference numbers correspond to similar elements for FIGS. 3A-4.

Figure 3:
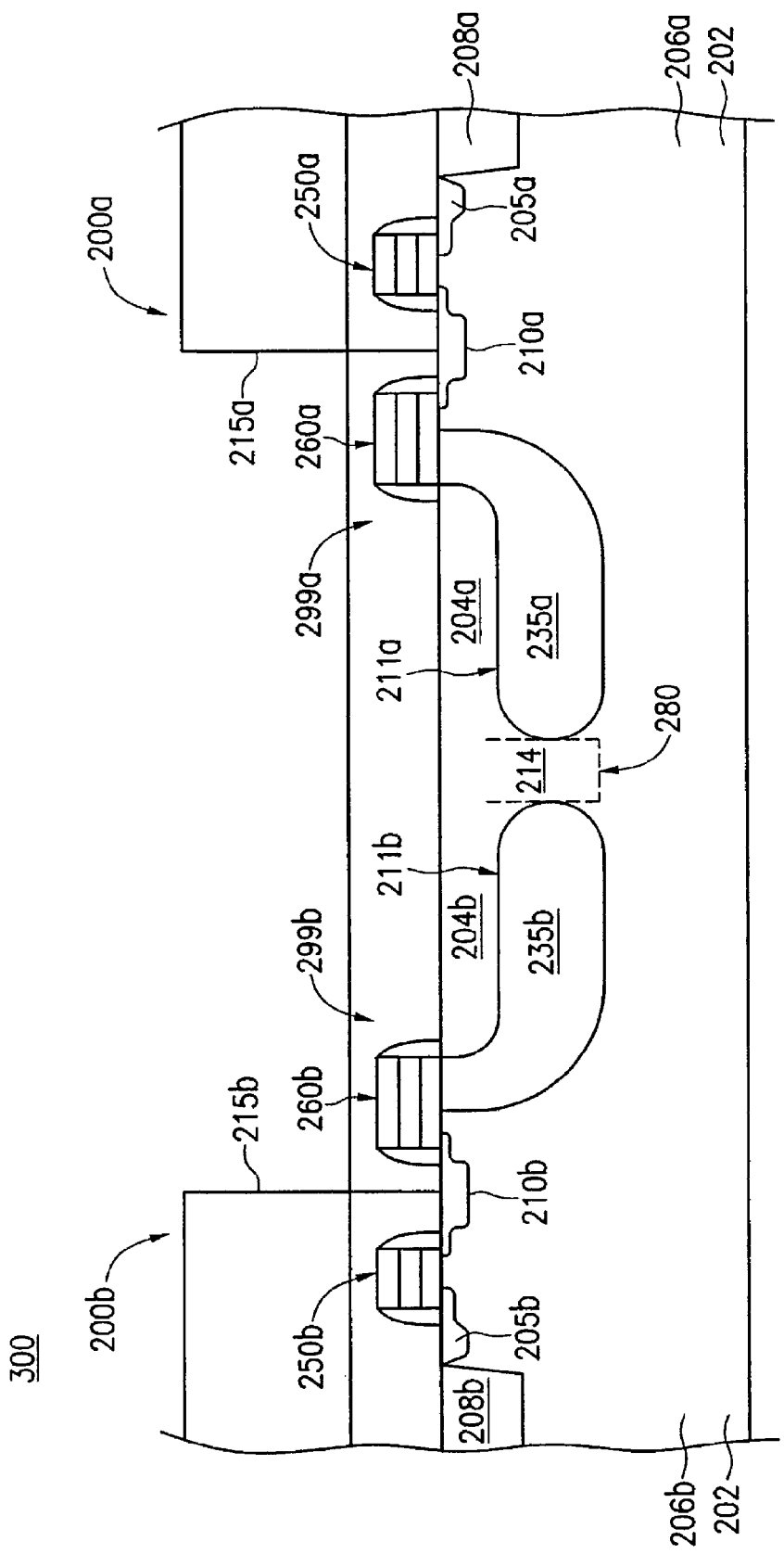
FIG. 3 is a diagrammatic side sectional view of a CMOS image structure formed in accordance with a first embodiment of the present invention in a 4T transistor.

Referring now to FIG. 3, in one exemplary embodiment, the present invention provides a first pixel cell 200a adjacent a mirror-image second pixel cell 200b to form the structure 300. The pinned photodiode 211a of the first pixel cell 200a shares a common p-type active region 280, which includes p-well 214, with the pinned photodiode 211b of the second pixel cell 200b. The common area, or active region 280, serves to isolate the pinned photodiode 211a of the pixel cell 200a from the pinned photodiode 211b of the adjacent pixel cell 200b. Thus, the presence of an intervening trench isolation region 8 (as depicted in FIG. 2) is not required.

The active region 280 provides good substrate to layers 204a and 204b contact for both pixel cells 200a and 200b. The active region 280 does not possess n– type dopant implants and includes p-type p-well region 214. Pixel cell 200a and pixel cell 200b, are isolated from other pixel cells by trench isolation regions 208a and 208b. However, there is no intervening trench isolation region between pixel cell 200a and 200b. Further, layers 204a and 204b are preferably p– type pinned layers 204a and 204b.

Active region 280 includes these p-type pinned layers 204a and 204b. The p-type pinned layers 204a and 204b may be implanted with p-type ions to form a p+ pinned layer 204a and 204b. It should be appreciated that although p-type pinned layers 204a and 204b can be formed as p+ pinned layers 204a and 204b, the pinned layers 204a and 204b can be formed as p– pinned layers 204a and 204b. Further still, pinned layers 204a and 204b can possess different concentrations of dopant ions from each other and pinned layers 204a and 204b can be formed by methods other than implantation as is known in the art. For instance, p-type pinned layers 204a and 204b can be formed by diffusion or other known methods.

The p-type pinned layers 204a and 204b are preferably formed with a dopant ion concentration in the range from approximately $5.0 \times 10^{17}$ per $cm^3$ to approximately $5.0 \times 10^{19}$ per $cm^3$. The p-well region 214 is preferably formed with a dopant ion concentration in the range from approximately $1.0 \times 10^{16}$ per $cm^3$ to approximately $5.0 \times 10^{17}$ per $cm^3$. The n-type regions 235a and 235b are preferably formed with a dopant ion concentration in the range from approximately $5.0 \times 10^{15}$ per $cm^3$ to approximately $1.0 \times 10^{18}$ per $cm^3$. The p+ substrate region 202 is preferably formed with a dopant ion concentration in the range from approximately $5.0 \times 10^{17}$ per $cm^3$ to approximately $5.0 \times 10^{19}$ per $cm^3$. The epitaxial layers, e.g., p– type regions 206a and 206b are preferably formed with a dopant ion concentration in the range from approximately $1.0 \times 10^{14}$ per $cm^3$ to approximately $1.0 \times 10^{16}$ per $cm^3$.

As a result, the resulting structure 300 enables a CMOS image device to be packaged to a smaller dimension than conventionally formed CMOS image devices, since adjacent pixel cells 200a, 200b are formed without the presence of an intervening trench isolation region and share a common area 280 which includes p– well region 214 and p-type pinned layers 204a and 204b. Further, a CMOS imager employing adjacent pixels 200a and 200b, will not generate as much dark current as some prior isolated pixel cells since the number of trench isolation regions for the imager is reduced. Moreover, the absence of a trench isolation region can allow the pinned photodiode's capacitance for pixel cells 200a and 200b to be increased, if desired. Specifically, pinned photodiode's 211a and 211b can be formed with larger charge collection regions 235a and 235b since the trench isolation region that typically separates adjacent pinned photodiodes is not present.

It should be noted that, although the invention is described in connection with use in a four-transistor (4T) pixel cell, the invention also has applicability to any CMOS imager including, for example, a three-transistor (3T) cell which differs from the 4T cell in the omission of a transfer transistor gate, illustrated and describe in FIG. 5.

It should also be noted that although pinned photodiodes 211a and 211b share a common active region 280, which includes p-well 214 and p-type pinned layers 204a and 204b, of the 4T FIG. 3 embodiment, pinned photodiode 211a sends electrons to transfer transistor gate 260a and pinned photodiode 211b, sends electrons to transfer transistor gate 260b. In the 3T FIG. 5 embodiment structure 400 described below, pinned photodiode 211a sends electrons to floating diffusion region 210a and pinned photodiode 211b sends electrons to floating diffusion region 210b.

A method for forming structure 300 will now be explained in reference to FIGS. 4A-4F. Elements designated with an "a" belong to the first pixel cell 200 and elements designated with a "b" belong to the second pixel cell 201.

Figure 4A:
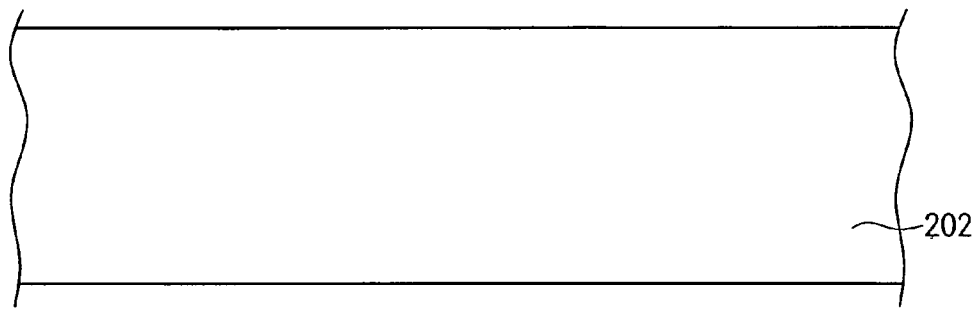
FIGS. 4A-4F are diagrammatic side sectional views of a CMOS image structure formed in accordance with a first embodiment of the present invention and its method of formation.

FIG. 4A illustrates a substrate 202 along a diagrammatic side sectional view of a CMOS image structure formed in accordance with a first embodiment of the present invention. For exemplary purposes, the substrate 202 is a silicon substrate formed to a predetermined thickness. However, as noted above, the invention has equal utility with other semiconductor substrates. Further, the substrate 202 is shared by the two pixel cells 200a and 200b. The substrate region 202 is preferably formed with a p-type dopant ion concentration in the range from approximately $5.0 \times 10^{17}$ per $cm^3$ to approximately $5.0 \times 10^{19}$ per $cm^3$. It should be appreciated that the substrate region 202 can have p-type dopant ions added at a subsequent processing step.

Figure 4B:
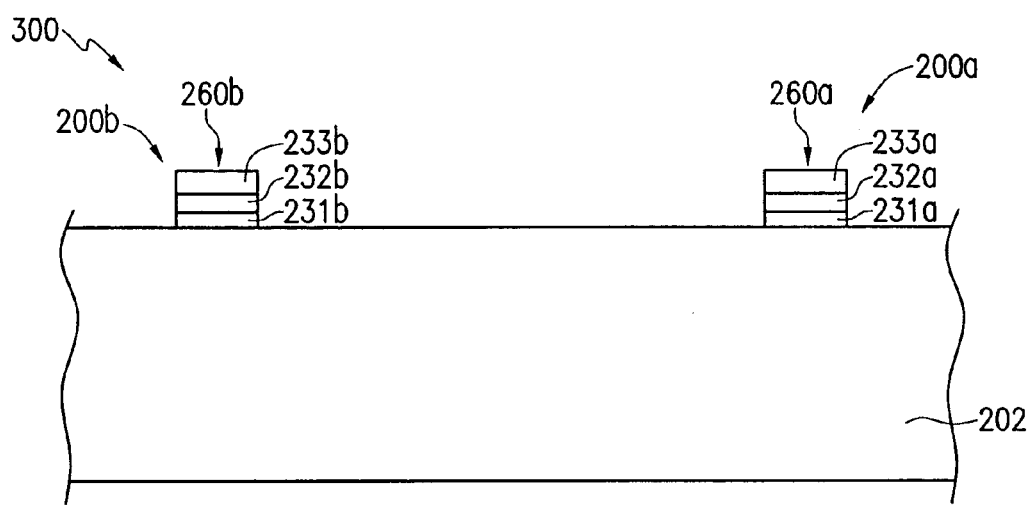

Next, FIG. 4B illustrates transfer transistor gate stacks 260a, 260b formed over the silicon substrate 202. The transfer transistor gate stacks 260a, 260b comprise a first gate oxide layer 231a, 231b of grown or deposited silicon oxide on the silicon substrate 202, a conductive layer 232a, 232b of doped polysilicon or other suitable conductor material, and a second insulating layer 233a, 233b which may be formed of, for example, silicon oxide (silicon dioxide), nitride (silicon nitride), oxynitride (silicon oxynitride), ON (oxide-nitride), NO (nitride-oxide), or ONO (oxide-nitrideoxide), among others. It should be appreciated that the transfer transistor gate stack 260a can comprise a different material, a different thickness, and a different shape from the transfer transistor gate stack 260b.

The first and second insulating layers 231a, 231b, 233a, and 233b, and the conductive layer 232a, 232b may be formed by conventional deposition methods, for example, chemical vapor deposition (CVD) or plasma enhanced chemical vapor deposition (PECVD), among many others. Further, it should be appreciated that the first and second insulating layers 231a, 233a and the conductive layer 232a can comprise different materials, be made to different thicknesses, or even be a different shape from the first and second insulating layers 231b, 233b and the conductive layer 232b of the second pixel cell 200b.

If desired, a silicide layer (not shown) may be also formed in the transfer transistor gate stacks 260a, 260b, between the conductive layers 232a, 232b and the second insulating layers 233a, 233b. Advantageously, the gate structures of all other transistors (not illustrated) in the imager circuit design may have this additionally formed silicide layer. This silicide layer may be titanium silicide, tungsten silicide, cobalt silicide, molybdenum silicide, or tantalum silicide, among others. The silicide layer could also be a barrier layer/ refractory metal such as TiN/W or $WN_X$/W, or it could be entirely formed of $WN_X$, among others.

Figure 4C:
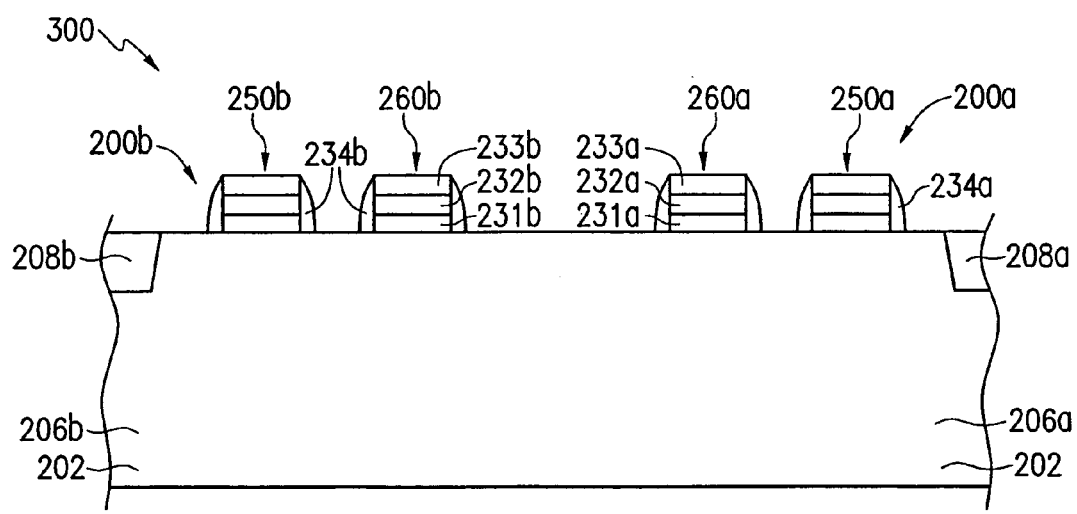

Next. FIG. 4C illustrates insulating sidewall spacers 234a, 234b formed on the sides of the transfer transistor gate stacks 260a, 260b through conventional methods. The sidewall spacers 234a, 234b may be formed, for example, of silicon dioxide, silicon nitride, silicon oxynitride, ON, NO, ONO or TEOS, among others.

In a similar manner, additional transistors can be provided such as reset transistors 250a, 250b, source follower transistors (not shown), and row select transistors (not shown) as described above in forming the transfer transistors 260a, 260b.

In addition, trench isolation regions 208a, 208b are formed within the substrate 202 to separate pixel cells 200a and 200b from adjacent pixel cells or structures. The trench isolation regions 208a, 208b are filled with a dielectric material, which may be an oxide material, for example a silicon oxide such as SiO or $SiO_2$, a thermally grown oxide, oxynitride, a nitride material such as silicon nitride, silicon carbide, a high temperature polymer, or other suitable dielectric materials. The dielectric may be also formed of any combination of oxide/nitride, nitride/oxide and oxide/nitride/oxide materials.

In a preferred embodiment, the trench isolation regions 208a, 208b are shallow trench isolation regions and the dielectric material is a high density plasma (HDP) oxide, a material which has a high ability to effectively fill narrow trenches. Although the isolation regions 208a, 208b are described as being formed after gate stacks 260a, 260b are formed, it should be appreciated that the trench isolation regions 208a, 208b can be formed prior to gate stacks 260a, 260b formation or even in a later step, such as after formation of pinned photodiodes 211a, 211b.

In addition, if desired, a thin insulating layer (not shown) may be formed on the sidewalls and bottoms of the shallow trench isolation regions before the filling of the trenches with the dielectric material which, as noted, is preferably a high density plasma (HDP) oxide. The thin insulating layer may be formed of an oxide or of silicon nitride or an oxide/nitride combination, for example, to aid in smoothing out the corners in the bottom of the trench and to reduce the amount of stress in the dielectric material used to later fill in the trenches.

Figure 4D:
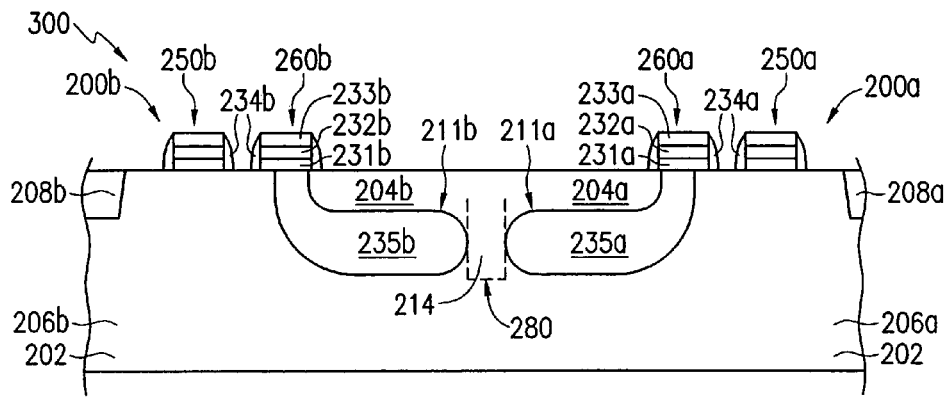

Referring now to FIG. 4D, p-n-p pinned photodiode 211a is formed by regions 204a, 206a, and 235a. Regions 204a, 206a, and 235a are formed to a predetermined dopant concentration. For example, region 204a is formed to have a p+ dopant concentration. However, although region 204a is described as a p+ type region, region 204a can also be a p-type region. Region 206a is formed to have a p− type dopant concentration that is less than the dopant concentration of region 204a. Region 235a is formed to have a n− type dopant concentration. Photodiode 211b, also a p-n-p pinned photodiode, is formed by regions 204b, 206b, and 235b. Similarly, regions 204b, 206.b, and 235b are formed in a similar manner to regions 204a, 206a, and 235a.

The pinned photodiodes 211a and 211b, of adjacent pixels 200a and 200b, share a common area 280 e.g., an active region. Active region 280 is the active area between the two adjacent pixel cells 200a and 200b which includes p-well 214 and p-type pinned surface layers 204a and 204b. The active region 280 provides a good surface to substrate contact e.g., p-type pinned surface layer 204a through p-well 214 to p− type region 206a to p-type substrate 202, for pixel cell 200a and p-type pinned surface layer 204b through p-well 214 to p− type region 206b to p-type substrate 202, for pixel cell 200b. The p-well region 214 is preferably formed with a dopant ion concentration in the range from approximately $1.0 \times 10^{16}$ per $cm^3$ to approximately $5.0 \times 10^{17}$ per $cm^3$. The p-well region 214 can be formed by implantation or other methods well known in the art.

The p− type doped regions or wells 206a and 206b, e.g., epitaxial regions, are formed in the areas of the substrate 202 directly beneath the active area of the pixel cells 200a and 200b by conducting a dopant implantation with a dopant of a first conductivity type, which for exemplary purposes is p− type. However, p− type doped regions 206a and 206b can be formed by methods other than ion implantation. The p-type doped layers or wells 206a, 206b may be formed subsequent to the formation of trench isolation regions 208a, 208b and of the transfer transistor gate stacks 260a, 260b. However, it should be understood that the p-type doped layers or wells 206a and 206b may also be formed prior to the formation of trench isolation regions 208a, 208b. The epitaxial layers, e.g., p− type regions 206a and 206b are preferably formed with a dopant ion concentration in the range from approximately $1.0 \times 10^{14}$ per $cm^3$ to approximately $1.0 \times 10^{16}$ per $cm^3$.

The n− type regions 235a and 235b are formed by implanting dopants of a second conductivity type, which for exemplary purposes is n-type, in the area of the substrate 202 directly beneath the active area of the pixel cells 200a and 200b. The implanted n-doped regions 235a and 235b form a photosensitive charge storage region for collecting photogenerated electrons for the pixel cells 200a and 200b. The n− type regions 235a and 235b are preferably formed with a dopant ion concentration in the range from approximately $5.0 \times 10^{15}$ per $cm^3$ to approximately $1.0 \times 10^{18}$ per $cm^3$. It should be appreciated that the n-type regions 235a and 235b can be formed with by methods other than implantation as is known in the art.

The n− type regions 235a and 235b are not connected nor touching each other. Active region 280 is present to at least some degree between the n− type regions 235a and 235b of the two adjacent pixel cells 200a and 200b. The presence of the active region 280, which includes p-well 214 and p-type pinned surface layers 204a and 204b, serves to isolate the two adjacent photodiodes 211a and 211b from each other. Moreover, active region 280 is commonly shared by the adjacent pixel cells 200a and 200b. Active region 280 should also not contain the dopant ions used to form charge collection regions 235a and 235b, e.g., n-type dopant ions.

The p− type pinned surface layers 204a and 204b are also formed by conducting a dopant implantation with a dopant of the first conductivity type, which for exemplary purposes is p− type, so that p− type ions are implanted into the area of the substrate 202 over the implanted n− type regions 235a and 235b and between the transfer transistor gates 460a and 460b. The p− type pinned layers 204a and 204b are preferably formed with a dopant ion concentration in the range from approximately $5.0 \times 10^7$ per cm$^3$ to approximately $5.0 \times 10^{19}$ per cm$^3$. It should be appreciated that the p− type pinned surface layers 204a and 204b can be formed with by methods other than implantation as is known in the art.

It should be further appreciated that the pixel cells 200a and 200b can have regions of different dopant ion concentrations from each other. For instance, n-type region 235a can possess a different dopant ion concentration from n-type region 235b. The p− type region 206a can have a different dopant ion concentration from p− type region 206b.

Although the above embodiment has been described with reference to the formation of p-n-p pinned photodiodes 211a and 211b having a n− type charge collection region 235a and 235b, it should be understood that the invention is not limited to this embodiment. Accordingly, the invention has equal applicability to n-p-n photodiodes comprising a p− type charge collection region. The dopant and conductivity type of all structures will change accordingly with the transfer gates corresponding to a PMOS transistor.

In addition, although regions 204a, 206a, and 235a are described as being formed simultaneously with regions 204b, 206b, and 235b, it should be appreciated that these regions can be formed at different times, with different dopant concentrations, and even different depths from each other so long as active region 280, which includes p-well 214, is shared by adjacent pixel cells 200a and 200b.

Figure 4E:
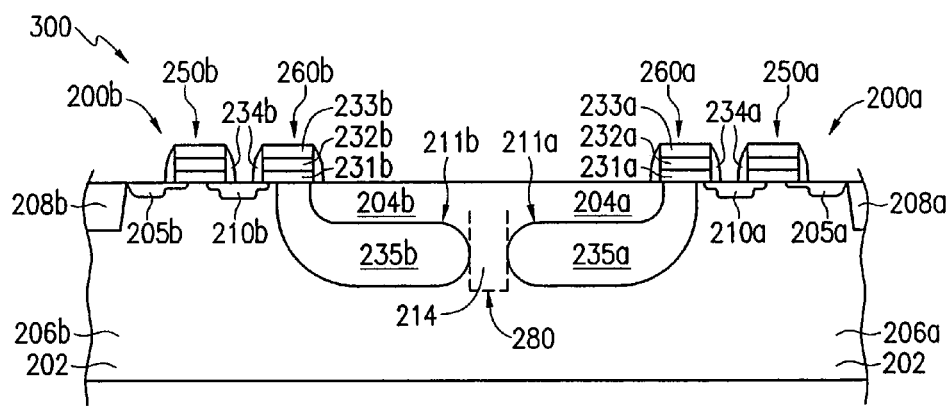

Next, FIG. 4E illustrates forming a n-type floating diffusion region 210a located adjacent the transfer transistor gate stack 260a and opposite the n− type doped region 235a of the p-n-p photodiode 211a. Similarly, n− type floating diffusion region 210b is formed adjacent the transfer transistor gate stack 260b and opposite the n− type doped region 235b of the p-n-p photodiode 211b. In this manner, the transfer transistor gate stack 260a transfers charge accumulated in the charge collection region 235a of the pinned photodiode 211a to the floating diffusion region 210a for example.

Further, FIG. 4E illustrates forming source/drain regions 205a and 205b for reset transistors 250a and 250b. It should be appreciated that the source/drain region 205a can have a different dopant concentration from the floating diffusion region 210a of reset transistor 250a. Similarly, the source/drain region 205b can have a different dopant concentration from the floating diffusion region 210b of the reset transistor 250b.

It should also be appreciated that the dopant concentrations and dopant ions used for pixel cell 200a can be different from dopant concentrations and dopant ions used in pixel cell 200b. For example, floating diffusion regions 210a, 210b, source/drain regions 205a, 205b, and pinned photodiodes 211a, 211b can possess different dopant concentrations and can be formed from different dopant ions.

For instance, the n− type dopant ions used for doping different regions of pixel cell 200a and pixel cell 200b may comprise phosphorus, arsenic, antimony, or other n− type dopant ions known in the art. Conversely, the p− type dopant ions used for doping different regions of pixel cell 200a and pixel cell 200b may comprise boron, beryllium, indium, magnesium, or other p− type dopant ions known in the art.

Figure 4F:
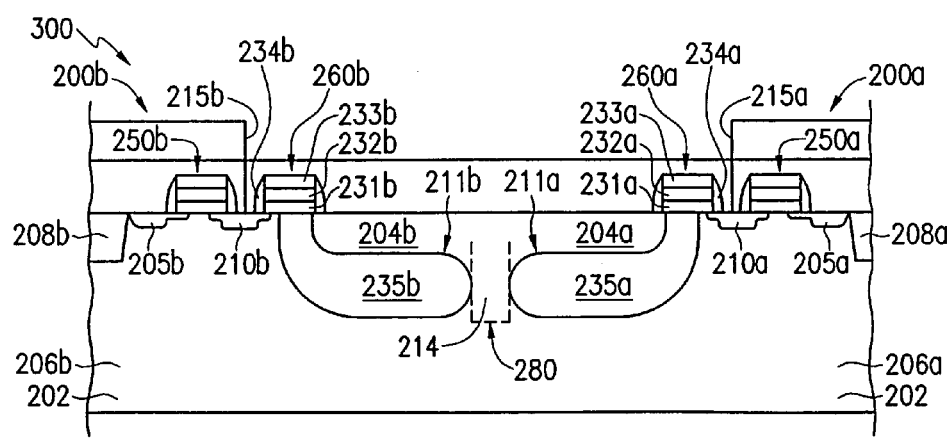

After the processing sequences to produce the pixel structure 300 illustrated in FIG. 3, the CMOS pixel structure 300 is then processed according to known methods to produce an operative pixel. For instance, as FIG. 4F illustrates, a transparent insulating layer 299a, 299b can be provided over the transfer transistors 260a, 260b and reset transistors 250a, and 250b. An opening can be formed and a metal conductor 215a can be used to connect the floating diffusion region 210a with a source follower transistor (not shown) and row select transistor (not shown). Similarly, an opening can be formed and a metal conductor 215b can be used to connect the floating diffusion region 210b with a source follower transistor (not shown) and row select transistor (not shown).

As FIGS. 3 and 4F illustrate, pinned photodiodes 211a, 211b can be formed with a greater charge collection region 235a, 235b. As a result, structure 300 has a greater capacitance than previous prior art structures as illustrated in FIG. 2. Further, in FIG. 2, a minimum distance D needed to be maintained from the trench isolation region 8 to avoid generating dark current and to have good p− surface 4 to p-type region 6 and p-type substrate 2 contact. In the present invention, there is no need to maintain a minimum distance D since the intervening trench isolation region 8 is omitted in the structure 300 of FIG. 3. Moreover, the presence of active area region 280, which includes p-well 214 and p− type pinned surface layers 204a and 204b, provides good p− type pinned surface 204a, 204b through p-well region 214 to p-type region 206a, 206b to p-type substrate 202 contact. Structure 300 also does not generate the dark current associated with the presence of a trench isolation region.

The structure 300 depicted in FIG. 3A and methods of forming such a structure depicted in FIGS. 4A-4F, relate to a 4T pixel which utilizes transfer transistors 260 and 260b for gating charge from the pinned photodiodes 211a and 211b to the floating diffusion regions 210a and 210b. Reference is now made to FIG. 5 which illustrates another exemplary embodiment of the present invention in a 3T pixel.

Figure 5:
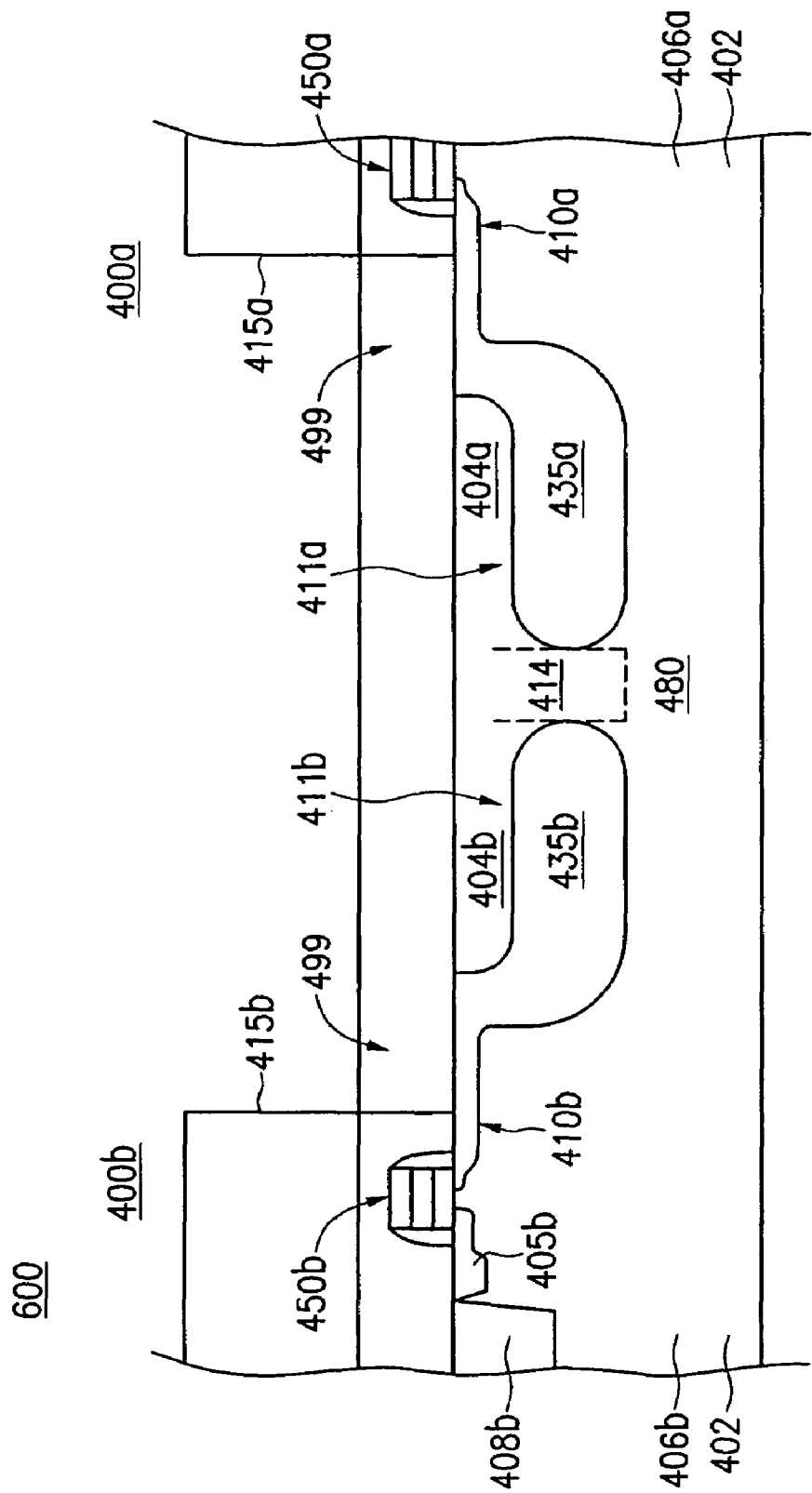
FIG. 5 is a diagrammatic side sectional view of a CMOS image structure formed in accordance with a second embodiment of the present invention.

In the 3T embodiment of FIG. 5, the charge collection regions 435a and 435b are connected with the floating diffusion regions 410a and 410b respectively, and the transfer transistors 260a and 260b of FIG. 3 are omitted. Otherwise, the structure 600 shown in FIG. 5 is the same as structure 300 in FIG. 3. Particularly, adjacent pixels 400a and 400b share a common active region 480 with p-well 414.

The methods of forming structure 600 is similar to the methods described above for forming structure 300. However, the transfer transistors 260a, 260b of FIG. 3, are not provided in this embodiment. Further, pinned photodiode 411a is connected to floating diffusion region 410a for pixel cell 400a. Similarly, pinned photodiode 411b is connected to floating diffusion region 410b for pixel cell 400b.

After the processing sequences to produce a pixel structure 600 illustrated in FIG. 5, the CMOS pixel structure 600 is then processed according to known methods to produce an operative pixel. For instance, a transparent insulating layer 499 can be provided over the reset transistors 450a and 450b. An opening can be formed for pixel cell 400a in the insulating layer 499a, 499b and a metal conductor 415a can be used to connect the floating diffusion region 410a with a source follower transistor (not shown) and row select transistor (not shown). Similarly, an opening can be formed for pixel cell 400b and a metal conductor 415b can be used to connect the floating diffusion region 410b with a source follower transistor (not shown) and row select transistor (not shown).

As a result, structure 300 or 600 enables a CMOS (or PMOS) image device to be formed with smaller dimensions. Specifically, the absence of a trench isolation region separating adjacent pixel cells allows more pixel cells to be formed on a semiconductor substrate for a given device. The pixel cell size is smaller since adjacent pixel cells share a common active region. In addition, reducing the number of trench isolation regions for a given CMOS or PMOS image device, can also reduce the generation of dark current since the presence of isolation regions can generate dark current. The structures 300 and 600 described above, can also provide the benefit of increasing the pinned photodiode's capacitance for each pixel cell. Specifically, a pixel cell can possess a larger photodiode collection region with the absence of a trench isolation region; thus, increasing the pixel cell's charge collection region and therefore its capacitance. Moreover, good p-type surface to p– type substrate contact is maintained through the common active region.

Figure 6:
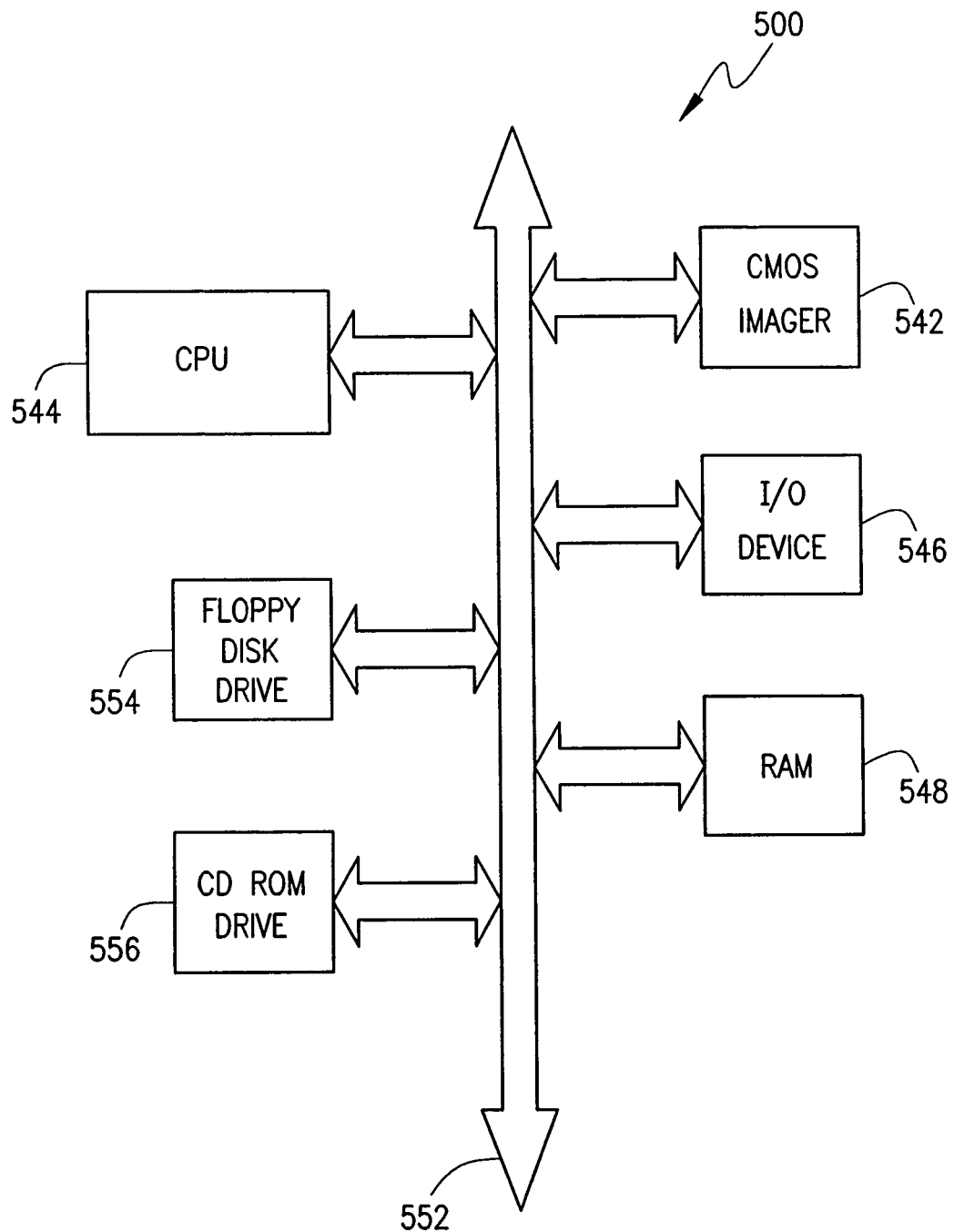
FIG. 6 illustrates a CMOS imager containing the invention with a processing system.

A typical processor based system which includes a CMOS imager device 542 having a pixel array in which the pixels are constructed according to the present invention is illustrated generally at 500 in FIG. 6. The imager device produces an output image from signals supplied from the pixel array. A processor based system is exemplary of a system receiving the output of a CMOS imager device. Without being limiting, such a system could include a computer system, camera system, scanner, machine vision system, vehicle navigation system, video phone, surveillance system, auto focus system, star tracker system, motion detection system, image stabilization system, all of which can utilize the present invention.

A processor based system, such as a computer system, for example generally comprises a central processing unit (CPU) 544, for example, a microprocessor, that communicates with an input/output (I/O) device 546 over a bus 552. The CMOS imager device 542 also communicates with the system over bus 552 or other communication link. The computer system 500 also includes random access memory (RAM) 548, and, in the case of a computer system may include peripheral devices such as a floppy disk drive 554 and a compact disk (CD) ROM drive 556 which also communicate with CPU 544 over the bus 552. It may also be desirable to integrate the processor 554, CMOS imager device 542 and memory 548 on a single IC chip.

The invention has been described with reference to pixels employing n– channel transistors. However, it should be understood that the invention is not so limited and may be employed in pixels have p– channel devices formed within a n– type substrate.

The above description and drawings are only to be considered illustrative of exemplary embodiments which achieve the features and advantages of the invention. Although exemplary embodiments of the present invention have been described and illustrated herein, many modifications, even substitutions of materials, can be made without departing from the spirit or scope of the invention. Accordingly, the above description and accompanying drawings are only illustrative of exemplary embodiments that can achieve the features and advantages of the present invention. It is not intended that the invention be limited to the embodiments shown and described in detail herein. The invention is limited only by the scope of the appended claims.

What is claimed as new and desired to be protected by Letters Patent of the United States is:

1. A method of forming a photodiode structure for use in an imaging device, said method comprising:
providing a first photodiode with a first conductivity type region formed in a semiconductor substrate, said first photodiode having a charge collection region of a second conductivity type for accumulating photogenerated charge,
wherein said first photodiode shares a common first conductivity type region with a second photodiode, and said first photodiode and said second photodiode are not separated by a trench isolation region.

2. The method of claim 1, wherein said first conductivity type is p– type and said second conductivity type is n– type.

3. The method of claim 1, wherein said first and second photodiodes are pinned photodiodes.

4. The method of claim 1, wherein said first photodiode is a p-n-p photodiode.

5. The method of claim 1, wherein said first photodiode is a n-p-n photodiode.

6. The method of claim 1, wherein said second photodiode further comprises a first conductivity type region formed over said semiconductor substrate, a charge collection region of a second conductivity type for accumulating photogenerated charge, wherein said charge collection region shares the first conductivity type region with said first photodiode.

7. The method of claim 6, wherein said first conductivity type is p– type and said second conductivity type is n– type.

8. The method of claim 6, wherein said second photodiode is a pinned photodiode.

9. The method of claim 6, wherein said second photodiode is a p-n-p photodiode.

10. The method of claim 6, wherein said second photodiode is a n-p-n photodiode.

11. A method of forming an image pixel structure comprising at least two adjacent image pixels, said method comprising:
forming a first pixel adjacent to a first trench isolation region, said first pixel comprising a first photodiode comprising a first doped region of a first conductivity in contact with a second doped region of a second conductivity; and
forming a second pixel adjacent to a second trench isolation region and adjacent said first pixel, said second pixel comprising a second photodiode comprising a first doped region of the first conductivity in contact with a second doped region of the second conductivity, said first doped regions of said first and second photodiodes comprising a common first doped region which does not contain an isolation region.

12. The method of claim 11, wherein said second doped regions of said first and second photodiode are separated by at least a portion of said first doped region.

13. The method of claim 11, wherein said first and second photodiodes are p-n-p photodiodes.

14. The method of claim 11, wherein said first and second photodiodes are n-p-n photodiodes.

15. A method of forming a photodiode structure, said method comprising:
forming a first photodiode comprising a first doped region of a first conductivity in contact with a second doped region of a second conductivity; and
forming a second photodiode comprising a first doped region of a first conductivity in contact with a second doped region of a second conductivity, wherein said first doped regions of said first and second photodiodes comprise a common first doped region which does not contain an isolation region.

16. A method as in claim 15, wherein said second doped regions of said first and second photodiode are separated by at least a portion of said first doped region.

17. A method as in claim 15, wherein said first and second photodiodes are pinned photodiodes.

18. A method as in claim 15, wherein said first and second photodiodes are p-n-p photodiodes.

19. A method as in claim 15, wherein said first and second photodiodes are n-p-n photodiodes.

20. A method as in claim 15, wherein said first conductivity is a p− type conductivity.

21. A method as in claim 15, wherein said second conductivity is a n− type conductivity.

22. A method of fabricating photodiodes comprising:
   implanting a first charge collection region in an active area of a substrate, wherein the substrate is a first conductivity type and the first charge collection region is a second conductivity type; and
   implanting a second charge collection region of the second conductivity type in the active area such that the active area is continuous between the first and second charge collection regions and are not separated by an isolation region,
   wherein said first charge collection region belongs to a first pixel cell, said second charge collection region belongs to a second pixel cell, and said first and second pixel cells are not separated by a trench isolation region.

23. A method of fabricating two adjacent pixel cells, said method comprising:
   forming a first trench isolation region for a pixel cell;
   forming a first photodiode structure for a first pixel cell, said first photodiode structure comprising implanting a first conductivity type region in an active area of a semiconductor substrate, wherein the substrate is a second conductivity type;
   forming a second photodiode structure for a second pixel cell, said second photodiode structure comprising implanting a first conductivity type region in a semiconductor substrate, wherein said substrate is a second conductivity type; and
   forming a second trench isolation region laterally spaced from said second pixel,
   wherein said adjacent pixel cells share the active area within said substrate and the active area between first conductivity type region of said first photodiode and said second photodiode does not contain a trench isolation region.

24. The method of claim 23, wherein said adjacent pixels are not separated by said first and second trench isolation regions.

25. The method of claim 23, wherein said first and second photodiodes are p-n-p photodiodes.

26. The method of claim 23, wherein said first and second photodiodes are n-p-n photodiodes.

* * * * *

UNITED STATES PATENT AND TRADEMARK OFFICE
CERTIFICATE OF CORRECTION

PATENT NO. : 7,244,646 B2 Page 1 of 1
APPLICATION NO. : 11/086347
DATED : July 17, 2007
INVENTOR(S) : Inna Patrick et al.

It is certified that error appears in the above-identified patent and that said Letters Patent is hereby corrected as shown below:

In the Specification, the following errors are corrected:

Column 3, line 40, "regions" should read --region--;

Column 4, line 35, "silicon-on-1" should read --silcon-on-sapphire--; and

Column 9, lines 11-12, "formed with by methods" should read --formed by methods--.

Column 12, line 54, "photodiode" should read --photodiodes--.

Signed and Sealed this

Sixteenth Day of October, 2007

JON W. DUDAS
*Director of the United States Patent and Trademark Office*